United States Patent
McKinnell et al.

(10) Patent No.: US 7,211,881 B2
(45) Date of Patent: May 1, 2007

(54) STRUCTURE FOR CONTAINING DESICCANT

(75) Inventors: James McKinnell, Salem, OR (US); Kenneth Diest, Corvallis, OR (US); Chien-Hua Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 185 days.

(21) Appl. No.: 10/808,068

(22) Filed: Mar. 24, 2004

(65) Prior Publication Data

US 2005/0212115 A1   Sep. 29, 2005

(51) Int. Cl.
*H01L 23/02* (2006.01)

(52) U.S. Cl. ........................ 257/678; 257/414

(58) Field of Classification Search ........ 257/414–425, 257/678–692
See application file for complete search history.

(56) References Cited

U.S. PATENT DOCUMENTS

| | | | |
|---|---|---|---|
| 3,770,498 A | 11/1973 | Flowers | |
| 4,427,992 A | 1/1984 | Ritchie et al. | |
| 4,630,095 A | 12/1986 | Otsuka et al. | |
| 4,977,009 A | 12/1990 | Anderson et al. | |
| 5,591,379 A | 1/1997 | Shores | |
| 5,989,984 A | 11/1999 | Anderson et al. | |
| 6,083,324 A | 7/2000 | Henley et al. | |
| 6,228,748 B1 | 5/2001 | Anderson et al. | |
| 6,534,850 B2 | 3/2003 | Liebeskind | |
| 6,740,145 B2 * | 5/2004 | Boroson et al. | 96/108 |
| 2002/0053401 A1 | 5/2002 | Ishikawa et al. | |
| 2002/0063322 A1 | 5/2002 | Robbins et al. | |
| 2002/0113549 A1 | 8/2002 | Yamazaki et al. | |
| 2002/0137329 A1 | 9/2002 | Fang et al. | |
| 2002/0149096 A1 | 10/2002 | Liebeskind | |
| 2002/0187254 A1 | 12/2002 | Ghosh et al. | |
| 2003/0020094 A1 * | 1/2003 | Shrauger | 257/200 |
| 2003/0020181 A1 | 1/2003 | Yamada | |
| 2003/0037677 A1 | 2/2003 | Boroson et al. | |
| 2003/0038590 A1 | 2/2003 | Silvernail et al. | |
| 2003/0067268 A1 | 4/2003 | Matsuoka | |
| 2003/0094691 A1 * | 5/2003 | Auch et al. | 257/704 |
| 2003/0132514 A1 | 7/2003 | Liebeskind | |
| 2003/0155655 A1 | 8/2003 | Fitzsimmons et al. | |

OTHER PUBLICATIONS

MSDS for SU-8 Series Resists Organic Resin Solution, Micro Chem, Newton, MA, 5 pages, Dec. 12, 2001.
MSDS for STAYDRY HiCap2000-Moisture Getter, Cookson Electronics—Semiconductor Products, Alpharetta, GA, 4 pages, Jun. 4, 2002.

* cited by examiner

Primary Examiner—Nathan W. Ha

(57) ABSTRACT

A hermetically sealed area includes a substrate having microelectronics thereon. A desiccant is operatively disposed within the hermetically sealed area. An equipotential region is substantially maintained around the desiccant.

13 Claims, 2 Drawing Sheets

STRUCTURE FOR CONTAINING DESICCANT

BACKGROUND

Embodiments of the present invention relate generally to microelectronics, and more particularly to a structure for containing desiccant in a wafer/die level packaged device.

Electronic devices generally function more efficiently if they are protected from ambient environments. Various packaging devices and methods for packaging electronic devices are known in order to keep the devices in working condition. These devices and methods often incorporate some sort of desiccant material within the package to absorb any moisture.

Many desiccating materials contain mobile ions. Generally, mobile ions are not compatible with microelectronics. Chemical electromigration of the desiccating material's mobile ions may in some instances lead to failure of the microelectronics.

SUMMARY

A hermetically sealed area is provided, including a substrate having microelectronics thereon. A desiccant is operatively disposed within the hermetically sealed area. An equipotential region is substantially maintained around the desiccant.

BRIEF DESCRIPTION OF THE DRAWINGS

Objects, features and advantages will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

DETAILED DESCRIPTION

As will be described further hereinbelow, in an embodiment of a structure for containing a desiccant, an equipotential cage is formed around the desiccant. It is believed that this generally advantageously removes the driving forces for mobile ion migration towards any associated microelectronics/electronic circuitry (e.g. an integrated circuit). As such, the likelihood of destroying and/or degrading the microelectronics may be substantially decreased. It is to be understood that the structure for containing desiccant may advantageously capture water vapor and/or moisture. Further, an embodiment of the present invention provides a flexible porous membrane, which may advantageously deform to allow volume expansion as moisture is adsorbed into the desiccant, as well as volume reduction as moisture is expelled from the desiccant.

Figure 1:
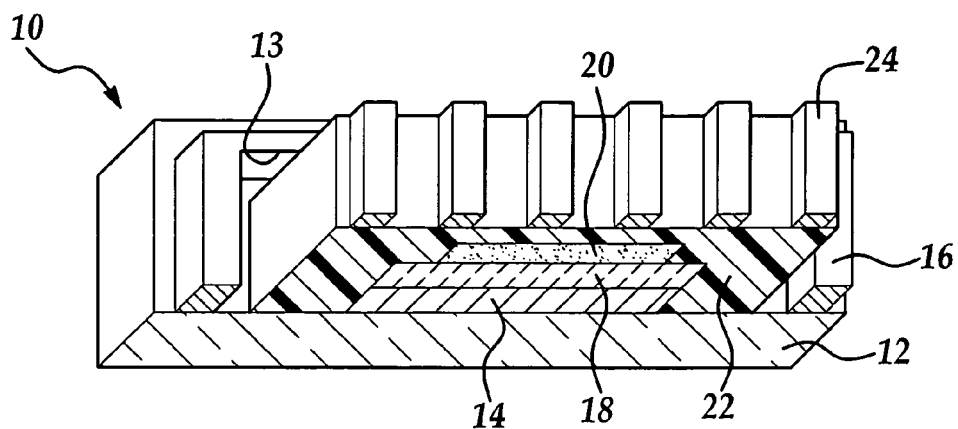
FIG. 1 is a cross-sectional perspective view of an embodiment of a structure for containing desiccant.

Referring now to FIG. 1, a structure for containing desiccant according to an embodiment of the present invention is generally designated as 10. The structure 10 for containing desiccant includes a substrate 12; a first metal layer 14 thereon; a second metal layer 16 defining a predetermined area 13 on the substrate 12; a dielectric layer 18 disposed on the first metal layer 14; a desiccant layer 20 disposed on the dielectric layer 18; a permeable membrane 22 overlaying and surrounding the desiccant layer 20, the dielectric layer 18 and the first metal layer 14; and metal traces 24 disposed on the permeable membrane 22.

Some non-limiting examples of suitable substrate 12 materials include single crystal silicon, polycrystalline silicon, silicon oxide containing dielectric substrates, alumina, sapphire, ceramic, glass, silicon wafers, and/or mixtures thereof. In an embodiment, a silicon wafer was chosen as the substrate 12.

The method for making the structure 10 for containing desiccant 20 according to an embodiment of the present invention includes the step of depositing the first metal layer 14 within a predetermined area 13 on the substrate 12. It is to be understood that any suitable metal may be used for the first metal layer 14. Examples of suitable metals for the first metal layer 14 include, but are not limited to gold, aluminum, tantalum, platinum, iridium, palladium, rhodium, nickel chromide, doped polysilicon, and/or mixtures thereof.

In an embodiment, the first metal layer 14 has a thickness ranging between about 0.2 µm and about 10 µm.

In an embodiment, the first metal layer 14, the second metal layer 16, and the metal traces 24 are held substantially equi-potential to the wafer and/or die and/or general region of the wafer/die, depending on whether a wafer level packaged device or a die level packaged device is being formed. This substantially eliminates any potential difference or electric field difference. It is to be understood that the first metal layer 14 may form a ground plane layer under the desiccant 20. It is to be understood that the first metal layer 14, the second metal layer 16, and the metal traces 24 may be held at ground potential.

It is contemplated that any suitable deposition technique may be used to deposit the first metal layer 14, second metal layer 16, dielectric layer 18, desiccant 20, and the permeable membrane 22. Some deposition techniques include, but are not limited to physical vapor deposition (PVD) (PVD includes, for example, co-sputtering, reactive sputtering, reactive co-sputtering, evaporation, pulsed laser deposition, ion beam methods), electronic-beam deposition techniques, chemical vapor deposition (CVD), plasma enhanced chemical vapor deposition (PECVD), atomic layer deposition (ALD), angle deposition (for example glancing angle deposition (GLAD)), and/or combinations thereof. In an embodiment, the metal layers 14, 16 are deposited by one of PVD, electronic-beam techniques and CVD, the dielectric layer 18 (generally an inorganic dielectric layer 18) is deposited by one of CVD and PECVD, and the permeable membrane 22 is deposited by one of spin coating, extrusion, lamination, dipping, spray coating, screen printing and CVD.

In an embodiment, the first metal layer 14 may optionally be patterned using standard photolithography techniques, followed by etching processes to remove any part of the metal layer not covered by the pattern. Suitable etching techniques include plasma etching and wet chemistry etching, depending on the metal used.

The method of an embodiment optionally includes the step of depositing a second metal layer 16 on the substrate 12 such that it defines a predetermined area 13 in which the first metal layer 14 (and the various other layers) is (are) deposited. The second metal layer 16 has a thickness ranging between about 0.2 µm and about 10 µm. Some non-limitative examples of the second metal layer 16 include gold, aluminum, tantalum, platinum, iridium, palladium, rhodium, nickel chromide, and/or mixtures thereof.

Figure 2:
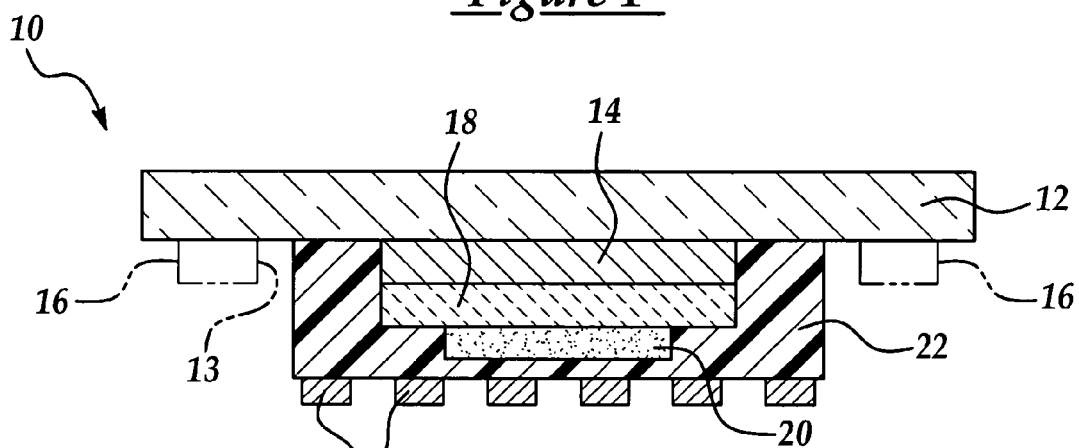
FIG. 2 is a cross-sectional view of an embodiment of a structure for containing desiccant.

Referring now to FIG. 2, in an embodiment, the first metal layer 14 may be deposited on the substrate 12 without the second metal layer 16 (shown in phantom) being deposited. It is to be understood that in this embodiment, the dielectric layer 18, the desiccant layer 20, the permeable membrane 22, and metal traces 24 are deposited on and/or over metal layer 14.

An embodiment of the method further includes the step of depositing the dielectric layer 18 on the first metal layer 14. It is to be understood that any suitable dielectric material may be chosen. In an embodiment, the dielectric layer 18 may be at least one of non-porous silicon nitride and/or silicon oxide. It is to be understood that if there is a large difference in ion concentration from one side of the structure 10 for containing desiccant 20 to the other side, a dielectric layer 18 may be desirable to act as a diffusion barrier. Further, the dielectric layer 18 may protect the desiccant layer 20 from the first metal layer 14. In an embodiment, the dielectric layer 18 has a thickness ranging between about 500 Angstroms and about 30 µm.

It is to be understood that the dielectric layer 18 may be patterned after it is deposited. Any suitable patterning technique may be used as described herein.

An embodiment of the method further includes the step of depositing the desiccant layer 20 on the dielectric layer 18. It is to be understood that any suitable desiccant material may be used. Some non-limitative examples of the desiccant material include, but are not limited to silica gel, calcium oxide, calcium sulfate, molecular sieves, and/or mixtures thereof. One non-limitative example of a suitable desiccant material is available commercially under the tradename HICAP 2000 from Cookson Electronics Inc. located in Alpharetta, Ga.

The desiccant layer 20 may be deposited using any suitable deposition technique. Further, the desiccant layer 20 may also be patterned using any suitable technique.

The method of making the structure 10 for containing desiccant 20 according to an embodiment of the present invention further includes the step of depositing a permeable membrane 22 over the desiccant layer 20, the dielectric layer 18, and the substrate 12.

In one embodiment of the structure 10 that includes the second metal layer 16, the permeable membrane 22 is deposited such that it covers and surrounds the desiccant layer 20, the dielectric layer 18 and the first metal layer 14, and is contained within the predetermined area 13 (shown in phantom in FIG. 2) defined by the second metal layer 16. In an alternate embodiment of the structure 10 that does not include the second metal layer 16, the permeable membrane 22 is deposited such that it covers and surrounds the desiccant layer 20, the dielectric layer 18 and the first metal layer 14.

It is to be understood that the permeable membrane 22 may be made of any suitable material, including, but not limited to a flexible polymeric material and a porous ceramic material. In an embodiment, membrane 22 is formed from a flexible polymeric material, such as, for example, photoresist materials. Other non-limitative examples of the flexible polymeric material include, but are not limited to poly (methyl methacrylate), polyesters, polycarbonates, polyimides and/or photosensitive polyamide, and/or mixtures thereof. One suitable photoresist material is commercially available under the tradename SU-8 from MicroChem, Inc. (previously Microlithography Chemical Corp.) in Newton, Mass. and from Gerstel SA in Tel-Aviv, Israel.

The flexibility of the permeable membrane 22 may advantageously allow the permeable membrane 22 to deform to allow volume expansion as moisture is absorbed into the desiccant layer 20, as well as to allow volume reduction as moisture is expelled from the desiccant layer 20.

In some instances, the use of a non-flexible porous ceramic permeable membrane 22 may be advantageous. Non-limitative examples of the porous ceramic material include, but are not limited to porous aluminum oxide and/or porous silicon dioxide.

The permeable membrane 22 may have a thickness ranging between about 500 Angstroms and about 30 µm. Also, the permeable membrane 22 may be patterned using any suitable technique as described herein.

It is to be understood that the materials chosen for the permeable membrane 22 and the desiccant layer 20 may be selected based on the desired end use for the structure 10. For example, an embodiment of the structure 10 for containing desiccant 20 may advantageously be used to capture water vapor. In this non-limitative example, any of the above listed permeable membranes 22 and desiccant 20 materials may be used.

The structure 10 for containing desiccant 20 further includes metal traces 24 deposited on the permeable membrane 22.

It is to be understood that the metal traces 24 may be made of any suitable metal. Some non-limitative examples of metals selected for the metal traces 24 include, but are not limited to gold, aluminum, tantalum, platinum, iridium, palladium, rhodium, nickel chromide, doped polysilicon and/or mixtures thereof. The metal traces 24 may be deposited using any suitable deposition technique as previously described. Still further, the metal traces 24 may be patterned by any suitable technique. In an embodiment, the metal traces 24 have a thickness ranging between about 0.2 µm and about 10 µm.

Figure 3:
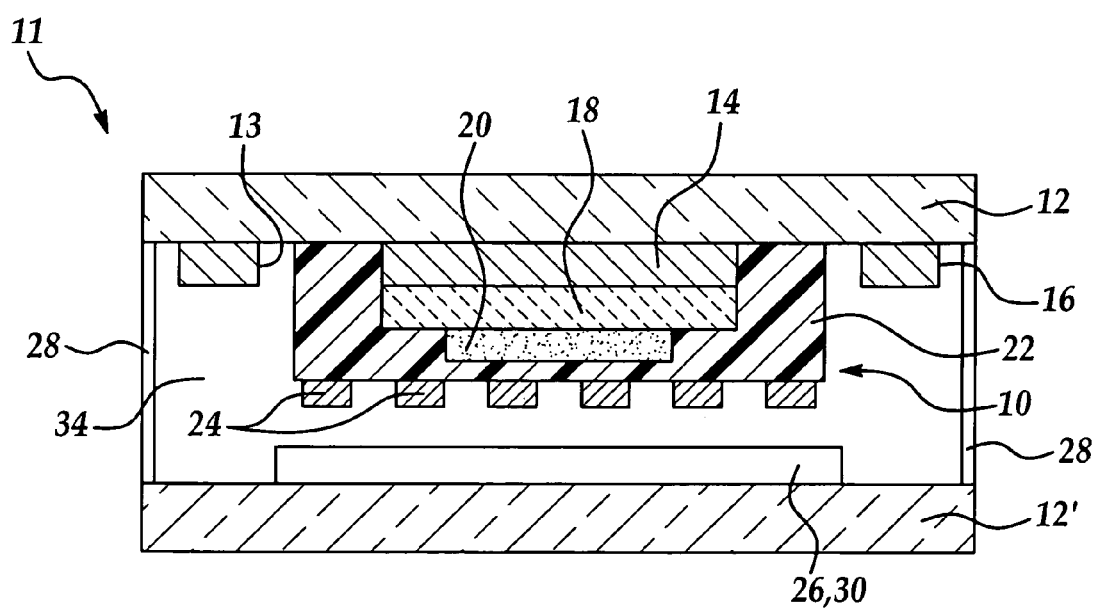
FIG. 3 is a cross-sectional view of a wafer level packaged device including the embodiment of FIG. 2.

Referring now to FIG. 3, it is contemplated that the structure 10 according to an embodiment of the present invention forms an equipotential cage/region around the desiccant layer 20, thus substantially preventing ion migration from the desiccant layer 20 toward any associated microelectronics/electronic circuitry 26, 30. Examples of microelectronics/electronic circuitry 26, 30 include, but are not limited to integrated circuits 30, micro-electro mechanical systems (MEMS) 26, etc.

A wafer level packaged device 11 includes an integrated circuit (IC) 30 and/or a micro-electro mechanical system (MEMS) 26 disposed on a suitable microelectronics substrate 12'.

It is to be understood that the substrate 12' may be any suitable substrate 12'. Some non-limitative examples of the substrate 12' include single crystal silicon, polycrystalline silicon, silicon oxide containing dielectric substrates, alumina, sapphire, ceramic, glass, silicon wafers, germanium wafers, and/or gallium arsenide wafers, and/or mixtures thereof.

In an embodiment of the present invention, the IC 30 or MEMS 26 disposed on the substrate 12' may be operatively disposed within a hermetically sealed area 34. Further, the structure 10 for containing desiccant 20 may also be operatively disposed within the hermetically sealed area 34. It is contemplated that bonds and/or seals 28 may be used to hermetically seal the substrate 12 of the structure 10 for containing desiccant 20 to the substrate 12' having the integrated circuit 30 and/or MEMS 26 thereon. The structure 10 may substantially remove the driving force for chemical electromigration of the mobile ions in the desiccant layer 20 toward the IC 30 and/or MEMS 26 by providing an embodiment of the equipotential cage/region described herein around the desiccant 20.

Figure 4:
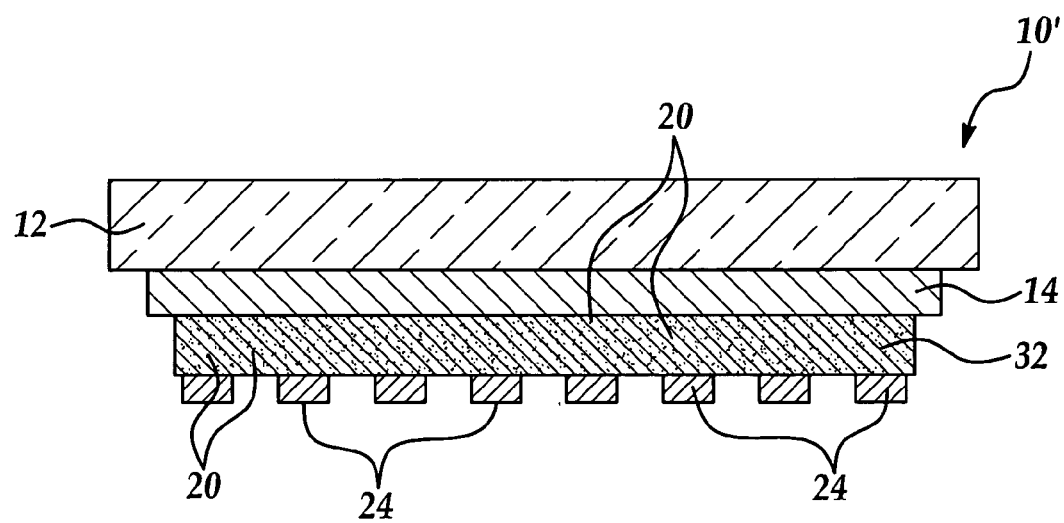
FIG. 4 is a cross-sectional view of an embodiment of a structure for containing desiccant showing an embodiment of the desiccant dispersed throughout an embodiment of the permeable membrane.

A structure according to another embodiment of the present invention is generally designated as 10', as depicted in FIG. 4. The structure 10' includes substrate 12, metal layer 14, a permeable membrane 32 having desiccant 20 dispersed therein, and metal traces 24.

The method for making the structure 10' according to another embodiment includes the step of depositing the metal layer 14 on the substrate 12. Any suitable deposition technique may be selected to deposit the metal layer 14 on the substrate 12. Further, the metal layer 14 may be patterned using any suitable patterning technique.

The method for making the structure 10' for containing desiccant 20 according to another embodiment further includes the step of depositing a permeable membrane 32 with desiccant 20 dispersed therein on the metal layer 14. It is to be understood that the desiccant 20 may be substantially homogenously dispersed throughout the permeable membrane 32. Some examples of the permeable membrane 32 with desiccant 20 dispersed therein include, but are not limited to a polymeric material having therein silica gel, calcium oxide, molecular sieves, and/or calcium sulfate, and/or a porous ceramic material having therein silica gel, calcium oxide, molecular sieves, and/or calcium sulfate. One permeable membrane 32 with desiccant 20 dispersed therein is commercially available under the tradename STAYDRY from Cookson Electronics in Alpharetta, Ga.

The permeable membrane 32 with desiccant 20 therein may be deposited using any suitable deposition technique, including, but not limited to spin coating, spray coating, extrusion, lamination, dipping, spray coating, CVD and screen printing. Additionally, the permeable membrane 32 with desiccant 20 therein may optionally be patterned using any suitable patterning technique, including, but not limited to etching (including photo and etch), laser ablation, imprinting, and photoresist lift-off.

The method according to an embodiment further includes the step of depositing a plurality of metal traces 24 on the permeable membrane 32. Any suitable deposition technique, as previously described, may be used. Further, some non-limitative examples of suitable metals for the metal traces 24 are gold, aluminum, tantalum, alloys thereof and/or mixtures thereof.

In an embodiment, the metal traces 24 may also be patterned by any suitable patterning technique.

It is contemplated that the structure 10' according to another embodiment substantially encloses the desiccant 20 within an equipotential cage/region.

Figure 5:
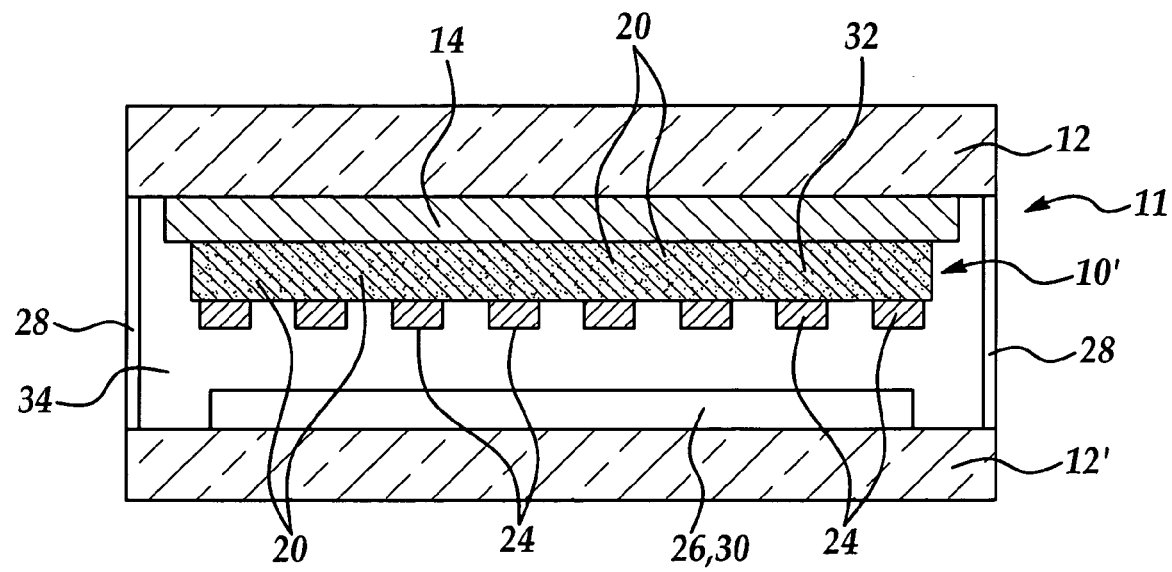
FIG. 5 is a cross-sectional view of a wafer level packaged device including the embodiment of FIG. 4.

Another embodiment of the wafer level packaged device 11, including an integrated circuit (IC) 30 and/or a microelectro mechanical system (MEMS) 26 disposed on a suitable microelectronics substrate 12', is depicted in FIG. 5.

In an embodiment, the IC 30 or MEMS 26 disposed on the substrate 12' may be operatively disposed within a hermetically sealed area 34. Further, the structure 10' for containing desiccant 20 may also be operatively disposed within the hermetically sealed area 34. It is contemplated that bonds and/or seals 28 may be used to hermetically seal the substrate 12 of the structure 10' for containing desiccant 20 to the substrate 12' having the integrated circuit 30 and/or MEMS 26 thereon. The structure 10' may substantially remove the driving force for chemical electromigration of the mobile ions in the desiccant layer 20 toward the IC 30 and/or MEMS 26 by providing an embodiment of the equipotential cage/region described herein around the desiccant 20.

A method of using the structure 10, 10' according to embodiments of the present invention includes the step of hermetically sealing the structure 10, 10' for containing desiccant 20 to a substrate 12' having microelectronics 26, 30 (non-limitative examples of which include an IC 30 and/or MEMS 26) thereon.

In an alternate embodiment, the structure 10, 10' may be disposed on the same substrate 12' upon which the microelectronics 26, 30 are located. Still further, it is contemplated that the structure 10, 10' for containing desiccant 20 may be disposed on a substrate 12 that is positioned at an angle from the substrate 12' having microelectronics 26, 30 thereon. Therefore, the structure 10, 10' for containing desiccant 20 may advantageously be used in wafer-level packaging as well as in die-level packaging.

Embodiments of the present invention provide many advantages, examples of which include, but are not limited to the following. Embodiment(s) of the present invention generally advantageously result in an enclosed desiccant 20 material, thus keeping the desiccant 20 material substantially separate from the microelectronics 26, 30. Further, without being bound to any theory, it is believed that the flexible porous membrane 22, 32 advantageously deforms to allow volume expansion as moisture is absorbed into the desiccant 20, and to shrink as moisture is expelled from the desiccant 20. Still further, embodiment(s) of the structure 10, 10' may generally advantageously provide an equipotential cage/region surrounding the desiccant 20, thus substantially removing one of the driving forces for mobile ion migration and advantageously protecting the microelectronics 26, 30 from degradation and destruction.

While several embodiments have been described in detail, it will be apparent to those skilled in the art that the disclosed embodiments may be modified. Therefore, the foregoing description is to be considered exemplary rather than limiting.

What is claimed is:

1. A structure for containing desiccant in at least one of a wafer level packaged device and a die level packaged device, the structure comprising:
   a substrate;
   a first metal layer disposed on the substrate within a predetermined area;
   a second metal layer defining the predetermined area;
   a dielectric layer disposed on the first metal layer;
   a desiccant disposed on the dielectric layer;
   a permeable membrane disposed on the desiccant and the dielectric layer, wherein the permeable membrane surrounds the desiccant, the dielectric layer and the first metal layer, and is within the predetermined area; and
   a plurality of metal traces disposed on the permeable membrane.

2. The structure as defined in claim 1 wherein the substrate is at least one of single crystal silicon, polycrystalline silicon, silicon oxide containing dielectric substrates, alumina, sapphire, ceramic, glass, silicon wafers, germanium wafers, gallium arsenide wafers, and mixtures thereof.

3. The structure as defined in claim 1 wherein the first metal layer, the second metal layer, and the metal traces are held substantially equi-potential to a potential of at least one of the wafer and the die.

4. The structure as defined in claim 1 wherein the first metal layer is at least one of gold, aluminum, tantalum, platinum, iridium, palladium, rhodium, nickel chromide, doped polysilicon, and mixtures thereof.

5. The structure as defined in claim 1 wherein the first metal layer is at least one of gold, aluminum, tantalum, platinum, iridium, palladium, rhodium, nickel chromide, doped polysilicon, and mixtures thereof.

6. The structure as defined in claim 1 wherein the plurality of metal traces is at least one of gold, tantalum, aluminum, platinum, iridium, palladium, rhodium, nickel chromide, and mixtures thereof.

7. The structure as defined in claim 1 wherein the dielectric layer comprises at least one of silicon oxide and silicon nitride.

8. The structure as defined in claim 1 wherein the permeable membrane comprises at least one of a polymeric material and a porous ceramic material.

9. The structure as defined in claim 8 wherein the polymeric material is a flexible material.

10. The structure as defined in claim 1 wherein the desiccant is at least one of silica gel, calcium oxide, calcium sulfate, and molecular sieves.

11. An integrated circuit, comprising:
a hermetically sealed area having the integrated circuit operatively disposed therein; and
a structure within the hermetically sealed area for containing a desiccant, the structure comprising:
a substrate;
a first metal layer disposed on the substrate within a predetermined area;
a second metal layer defining the predetermined area;
a dielectric layer disposed on the first metal layer;
a desiccant disposed on the dielectric layer;
a permeable membrane disposed on the desiccant and the dielectric layer, wherein the permeable membrane surrounds the desiccant, the dielectric layer and the first metal layer, and is within the predetermined area; and
a plurality of metal traces disposed on the permeable membrane.

12. A structure for containing desiccant in at least one of a wafer level packaged device and a die level packaged device, the structure comprising:
a substrate;
a metal layer disposed on the substrate;
a dielectric layer disposed on the metal layer;
a desiccant disposed on the dielectric layer;
a permeable membrane disposed on the desiccant and the dielectric layer, wherein the permeable membrane surrounds the desiccant, the dielectric layer and the metal layer; and
a plurality of metal traces disposed on the permeable membrane.

13. The structure as defined in claim 12 wherein the metal layer and the metal traces are held substantially equipotential to a potential of at least one of the wafer and the die.

* * * * *

UNITED STATES PATENT AND TRADEMARK OFFICE
CERTIFICATE OF CORRECTION

PATENT NO. : 7,211,881 B2 Page 1 of 1
APPLICATION NO. : 10/808068
DATED : May 1, 2007
INVENTOR(S) : James McKinnell et al.

It is certified that error appears in the above-identified patent and that said Letters Patent is hereby corrected as shown below:

In column 6, line 55, in Claim 1, after "layer" insert -- , --.

In column 7, line 5, in Claim 5, delete "first" and insert -- second --, therefor.

In column 8, line 7, in Claim 11, after "layer" insert -- , --.

In column 8, line 22, in Claim 12, after "layer" insert -- , --.

Signed and Sealed this

Fourth Day of November, 2008

JON W. DUDAS
*Director of the United States Patent and Trademark Office*